United States Patent [19]

Igashira et al.

[11] Patent Number: 4,471,256

[45] Date of Patent: Sep. 11, 1984

[54] PIEZOELECTRIC ACTUATOR, AND VALVE APPARATUS HAVING ACTUATOR

[75] Inventors: Toshihiko Igashira, Toyokawa; Yasuyuki Sakakibara, Nishio; Eturo Yasuda, Okazaki, all of Japan

[73] Assignee: Nippon Soken, Inc., Nishio, Japan

[21] Appl. No.: 504,304

[22] Filed: Jun. 14, 1983

[30] Foreign Application Priority Data

Jun. 14, 1982 [JP] Japan ................................. 57-100750
Jul. 6, 1982 [JP] Japan ................................. 57-118073

[51] Int. Cl.$^3$ ............................................. H01L 41/08
[52] U.S. Cl. ................................. 310/328; 239/585; 310/359; 310/365; 310/369
[58] Field of Search ............... 310/328, 369, 359, 365; 239/585

[56] References Cited

U.S. PATENT DOCUMENTS

| | | | |
|---|---|---|---|
| 3,154,700 | 10/1964 | McNaney | 310/328 |
| 3,364,368 | 1/1968 | Sonderegger | 310/338 |
| 3,390,287 | 6/1968 | Sonderegger | 310/369 |
| 3,461,910 | 8/1969 | Selsam et al. | 310/328 |
| 3,474,268 | 10/1969 | Rudnick | 310/328 |
| 3,489,931 | 1/1970 | Teaford | 310/328 X |
| 3,501,099 | 3/1970 | Benson | 310/328 X |
| 3,521,090 | 7/1970 | Angeloff | 310/359 X |
| 4,011,474 | 3/1977 | O'Neill | 310/328 |
| 4,087,716 | 5/1978 | Heywang | 310/359 X |

*Primary Examiner*—Mark O. Budd
*Attorney, Agent, or Firm*—Cushman, Darby & Cushman

[57] ABSTRACT

A piezoelectric actuator comprising a tubular casing and an elongated piezoelectric member disposed in the casing. The piezoelectric member has axially spaced ends, one of which abuts the shoulder of the casing. The piezoelectric member expands and contracts in response to an applied voltage, another end effecting a pumping operation. The piezoelectric member forms first and second longitudinal surfaces extending along substantially the entire length of axis. The piezoelectric member is formed as a lamination of a plurality of piezoelectric plates, to each of which is applied an electrode element on one of lateral surfaces. The electrode elements protrude on the first or second surfaces, alternately. First and second electrode members are located at the first and second surfaces, respectively. The first surface may be a surface of an opening which extends through the piezoelectric member, and the second surface may be a surface of an outer cylindrical surface of the piezoelectric member. Since the outer cylindrical surface is kept in contact with the inner surface of the casing, no flashover occurs between the surfaces. The second surface also may be a surface of another opening which extends through the piezoelectric member. In this embodiment, since the outer cylindrical surface has no electrode element, no flashover occurs between the outer cylindrical surface and the inner surface of the casing. A valve apparatus having the above-mentioned actuator and a method of manufacturing a piezoelectric member are also disclosed.

4 Claims, 7 Drawing Figures

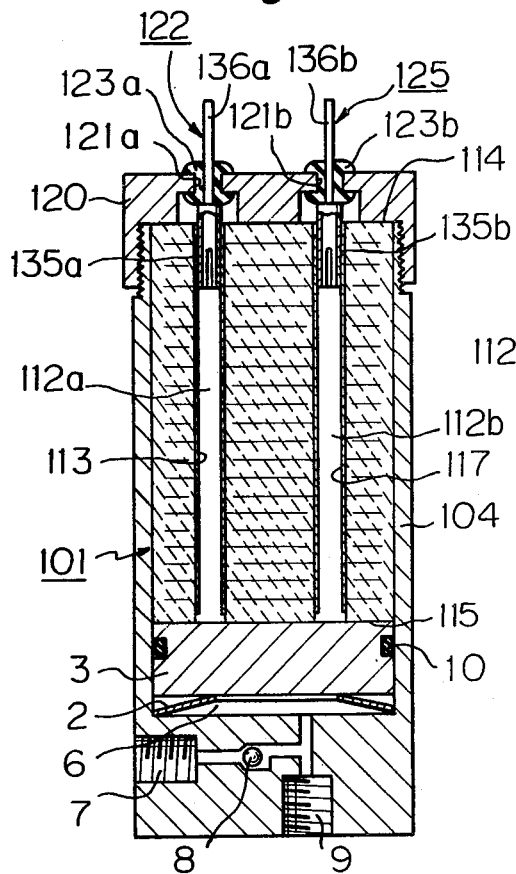
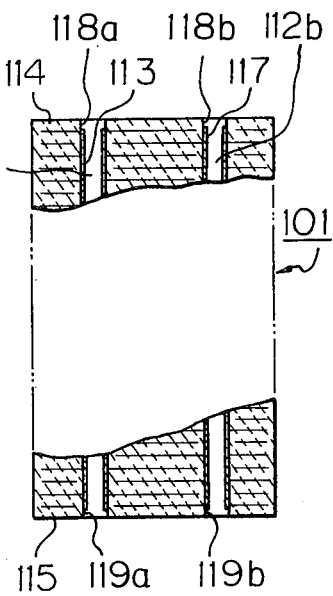
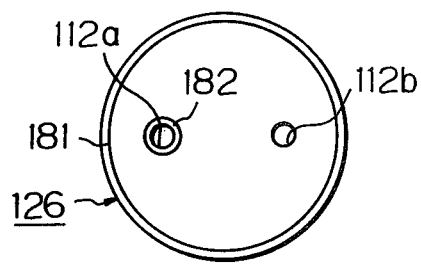
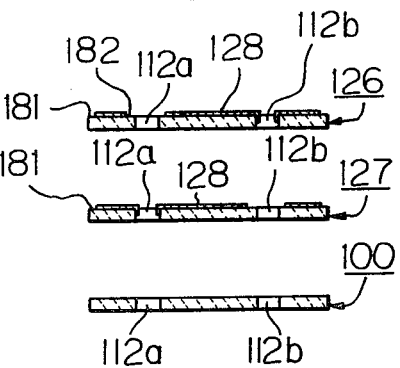

PIEZOELECTRIC ACTUATOR, AND VALVE APPARATUS HAVING ACTUATOR

BACKGROUND OF THE INVENTION

1. Field of the Invention

The present invention relates to a piezoelectric actuator using the piezoelectric effect occurring in a dielectrics made of ceramic, the actuator being used, for example, for a fuel injection pump.

2. Description of the Prior Art

It is known to constitute an actuator to work by the piezoelectric effect of a dielectric made of ceramic, such as $Pb\ Ti\ O_3 - Pb\ Zr\ O_3$ (PZT). Generally, the actuator is constituted by laminating a number of dielectric plates, each of which forms, at both of its surfaces, a pair of metallic electrode layers. When laminating the dielectric plates on each other, usually a thin metallic electrode plate is inserted between the plates. In the operation of a piezoelectric actuator, a few hundred volts are applied to the dielectric plates through the metallic electrode plates to create strain in the dielectric plates.

Conventional piezoelectric actuators, however, have several disadvantages. First, there is a problem of flashover both between the actuator and casing and between adjacent metallic electrode plates at an outer periphery of the actuator. When such flashover occurs, the actuator does not expand or contract and cannot effect its pumping or other operation.

Also, expansion or contraction of the piezoelectric plates deforms the metallic electrode plates to some extent due to their elasticity, thus, reducing the amount of displacement of laminated piezoelectric plates. Further, the dielectric plates may be damaged when the thickness of each plate is not uniform or the plates are cambered.

SUMMARY OF THE INVENTION

An object of this invention is to provide a piezoelectric actuator which overcomes these disadvantages.

Another object of this invention is to provide a valve apparatus incorporating the piezoelectric actuator.

A further object of this invention is to provide a method of manufacturing a piezoelectric member for use in a piezoelectric actuator.

According to the present invention, there is provided a piezoelectric actuator comprising a tubular casing and an elongated piezoelectric member disposed in the casing. The piezoelectric member has axially spaced ends, one of which abuts the shoulder of the casing. The piezoelectric member expands and contracts in response to an electric potential difference. The piezoelectric member forms first and second longitudinal surfaces extending along substantially the total length of the axis. The piezoelectric member is formed as a lamination of a plurality of piezoelectric plates, each piezoelectric plate having a pair of axially spaced lateral surfaces. An electrode element is arranged on one of the lateral surfaces of each piezoelectric plate away from the electrode element of the adjacent piezoelectric plate. In one piezoelectric plate, the electrode element extends to the first surface. In the adjacent piezoelectric plate, the electrode element extends to the second surface.

The piezoelectric actuator comprises a working means, a first electrode means, and a second electrode means. The working means moves in response to expansion and contraction of the piezoelectric member. The working means is connected to the other end of the piezoelectric member.

The first electrode means defines a first electrode located at the first surface along substantially the entire length of the axis. The first electrode is electrically connected with every electrode element extending to the first surfaces.

The second electrode means defines a second electrode located at the second surface along substantially the entire length of the axis. The second electrode is electrically connected with every electrode element extending to the second surface.

Preferably, adjacent piezoelectric plates are sintered together with the electrode elements therebetween at the facing surfaces thereof under a compressed condition.

BRIEF DESCRIPTION OF THE DRAWINGS

In the drawings;

FIG. 4 is a sectional view of a second embodiment of the present invention;

FIG. 5 is a sectional view of a piezoelectric member of the second embodiment;

FIG. 6 is a plan view of a piezoelectric plate of the second embodiment; and

FIG. 7 is a sectional view of piezoelectric plates of the second embodiment.

DESCRIPTION OF THE PREFERRED EMBODIMENTS

Figure 1:
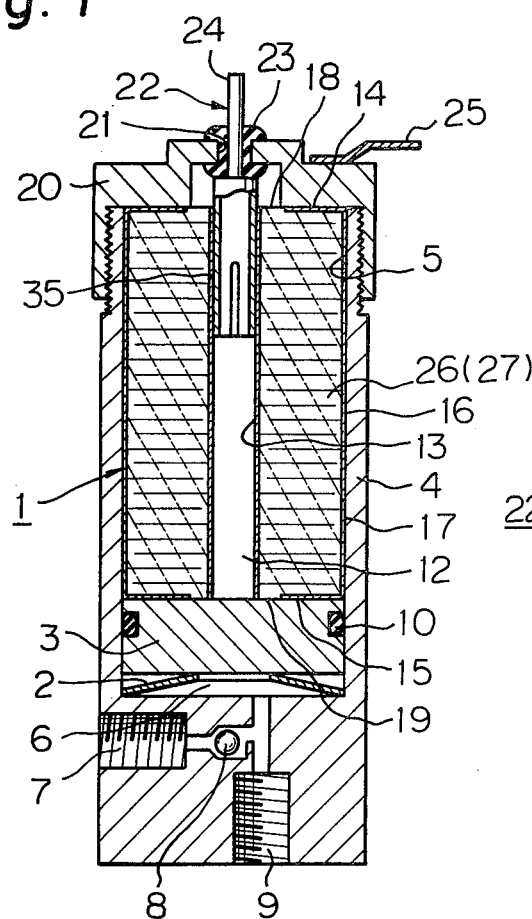
FIG. 1 is a sectional view of a first embodiment of the present invention.

In FIG. 1 is shown a piezoelectric actuator according to the invention as applied to a fuel injection pump. A piezoelectric member 1 constituted from a dielectric made of ceramic is accommodated, together with a conical spring 2 and a piston 3, in a cylinder bore 5 which is formed in a casing 4. The piston 3 is slidably arranged in the cylinder bore 5 and urged upward by the conical spring 2 of a pump chamber 6 formed under the cylinder bore 5. Accordingly, the piston 3 always abuts the lower end of the piezoelectric member 1.

At the lower portion of the casing 4, an inlet port 7 and an outlet port 9 are formed. The outlet port 9 is directly communicated with the pump chamber 6, while the inlet port 7 is communicated with the chamber 6 through a check valve 8. The inlet port 7 may be connected to a fuel tank (not shown), and the outlet port 9 may be connected to a fuel injection valve (not shown), whereby a fuel injection system is constructed.

The piston 3 moves downward against the conical spring 2 when the piezoelectric member 1 expands. As a result, the volume of the pump chamber 6 decreases. To the contrary, when the piezoelectric member 1 contracts, the conical spring 2 pushes up the piston 3, so that the volume of the pump chamber 6 increases. Thus, a pumping operation takes place, whereby fluid is sucked in the pump chamber 6 through the inlet port 7 and the check valve 8 and is discharged from the outlet port 9.

A seal ring 10 is disposed on an outer cylindrical surface of the piston 3, so that a fluid (e.g., fuel) in the pump chamber 6 cannot leak to the piezoelectric member 1.

The piezoelectric member 1 is formed by laminating a plurality of piezoelectric plates 26 and 27. The piezoelectric member 1 is cylindrically shaped with a diameter approximately the same as that of the cylinder bore 5. The member 1 has formed at its axial portion an opening 12 which extends along substantially the entire length of the axis. The surface of the opening 12 is nickel plated to form a first electrode surface 13 thereon. An upper end 14, a lower end 15, and an outer cylindrical surface 16 of the piezoelectric member 1 are also nickel plated to form a second electrode surface 17. The outer cylindrical surface 16 is connected to the upper end 14, and the lower end 15, however, it is spaced from the first electrode surface 13 with annular spaces of 1 to 2 mm at an inner periphery of the upper end 18 and an inner periphery of the lower end 19.

Figure 2:
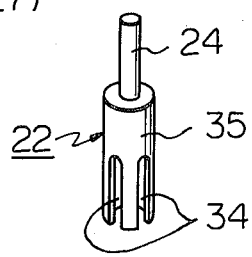
FIG. 2 is a perspective side view of an electrode rod.

The lower end 15 of the piezoelectric member 1 always abuts against the piston 3 as mentioned above, while the upper end 14 always abuts against a shoulder, i.e., an inner surface of a cap 20. The cap 20 is thread mounted on the casing 4 so as to close the upper opening thereof. An aperture 21 is formed at the center of the cap 20. A positive electrode rod 22 disposed in the aperture 21 projects outward therethrough. The electrode rod 22 is secured to the cap 20 by a grommet 23 made of rubber. The electrode rod 22 is made of copper or aluminum. The portion located in the casing 4 comprises a tubular portion 35, which forms slits 34, as shown in FIG. 2, so as to be elastic in the radial direction. Therefore, the tubular portion 35 is in slidable contact with the first electrode surface 13 formed in the opening 12. On the other hand, a portion 24 which projects from the cap 20 is a solid rod, which is used for electric wiring. A negative electrode plate 25 is welded on a edge of the cap 20 also for electric wiring.

Figure 3:
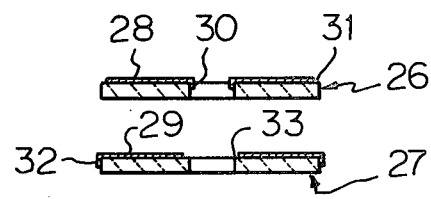
FIG. 3 is a sectional view of piezoelectric plates.

The piezoelectric member 1 is formed as a lamination of a plurality of plates 26 and 27 shown in FIG. 3. The plates 26 and 27 are similarly shaped disks with holes formed at the center. An electrode layer 28 of platinum (Pt) is provided on the upper lateral surface of the plate 26, and an electrode layer 29 of Pt is provided on the upper lateral surface of the plate 27.

The plates 26 and 27 are manufactured by compounding powders of PbO, $ZrO_2$, and $TiO_2$, and mixing a binder (an adhesive) such as polyvinyl alcohol (PVA). The clay material thus formed is then made into a thin sheet with a thickness of 0.1 to 0.5 mm. From the sheet, a plurality of annular plates are stamped out. Pt is applied in a paste state on one surface of each annular plate as an electrode element. The Pt paste may be made by compounding high density powder of Pt with an organic solvent such as PVA.

The Pt electrode layer 28 applied on the plate 26 extends into the center hole of the disk by 1 to 2 mm, as shown by reference numeral 30, and is retracted from the outer periphery of the disk by 1 to 2 mm, as shown by reference numeral 31. The Pt electrode layer 29 applied on the plate 27 extends over the outer periphery of the disk by 1 to 2 mm, as shown by reference numeral 32, and is retracted from the center hole by 1 to 2 mm, as shown by reference numeral 33.

In forming the lamination, a plate 27 is placed at the bottom, then alternate plates 26 and 27 are piled thereon. In this embodiment, assume 100 such plates are used. At the top of the stack is placed a plate with no Pt layer. Then, the stack of plates 26 and 27 is compressed along the axial direction while the plates 26 and 27 are heated near 200° C. to adhere them to each other. Finally, the stack is sintered near 1200° C. The result is an integral body of ceramic. During the sintering operation, the organic solvent added to the paste Pt evaporates to vanish from the plates 26 and 27. After that, the surfaces of the laminated body are nickel plated to form the first electrode surface 13 on the opening 12 and to form the second electrode surface 17 on the upper end 14, the lower end 15, and the outer surface 16.

A pump comprising the piezoelectric member 1 constructed as above operates to draw a fluid through the inlet port 7 and discharge the fluid through the outlet port 9. First, about 500 volts are applied between the positive electrode rod 22 and the negative electrode plate 25. These 500 volts are then generated, in the piezoelectric member 1, between Pt electrode layers 28 and 29 of alternatively arranged plates 26 and 27. As a result, each two adjacent layers 28 and 29 extend about 0.5 micron. As there are 100 such plates in this embodiment, the piezoelectric member 1 extends about 50 microns along the axial direction. Accordingly, the piston 3 moves downward against the conical spring 2 and decreases the volume of the pump chamber 6, discharging fluid in the chamber 6 through the outlet port 9. After that, the voltage is released and the piezoelectric member 1 returns to its original length. Therefore, the piston 3 is pushed back upward by the conical spring 2 to suck fluid in a tank in the pump chamber 6 through the inlet port 7. The above-mentioned movement is repeated, resulting in a pumping operation.

In the pumping operation, since the outer surface of the piezoelectric member 1 is always in contact with the casing 4 or the cap 20, the electric potential of the outer surface is equal to the electric potential of the casing 4 or the cap 20. Therefore, flashover cannot occur between the piezoelectric member 1 and the casing 4.

Further, since there is no gap between adjacent plates, flashover cannot occur between the Pt electrode layers of the plates. Even if the thickness of the plates is not uniform or plates are cambered before lamination, no plates are damaged because the piezoelectric member 1 is formed into a uniform body when sintering. Since no metallic electrode plate is disposed between adjacent electric plates, the expansion and contraction of the piezoelectric member are not reduced due to elasticity of metallic plates.

In FIGS. 4 and 5 are shown a second embodiment of the present invention. In this embodiment, a piezoelectric member 101 has two openings 112a and 112b extending along substantially the entire length of the axis of the member 101. Electrode surfaces 113 and 117 composed of nickel plating are formed on the inner surfaces of the opening 112a and 112b, respectively. The electrode surfaces 113 and 117 are not applied at margin 118a and 118b or 119a and 119b adjacent to ends 114 and 115. The margin are approximately 1 to 2 mm.

A cap 120 has an aperture 121a coaxial to the opening 112a and an aperture 121b coaxial to the opening 112b. Grommets 123a and 123b made of rubber are disposed in the apertures 121a and 121b, respectively. Electrode rods 122 and 125 project outward therethrough.

The electrode rods 122 and 125 are identical in shape. They are composed of tubular portions 135a and 135b and solid portions 136a and 136b and are made of copper or aluminum. The tubular portions 135a and 135b have slits as shown in FIG. 2 so as to be elastic in the radial directions. The outer surfaces of the tubular portions 135a and 135b are in slidable contact with inner surfaces of the openings 112a and 112b, respectively, so as to be in electrical contact with the electrode surfaces 113 and 117.

Other constructions of the second embodiment are similar to the first embodiment, and the corresponding portions are indicated with the same reference numerals.

A manufacturing process of the piezoelectric member 101 is described in reference to FIGS. 6, 7. First, a thin sheet containing PbO, ZrO$_2$, and TiO$_2$ is formed by the same method as the first embodiment. A plurality of disk plates which have two openings 112a and 112b are stamped out from the thin sheet.

A Pt electrode layer 128 is applied on one of the surfaces of each plate to form a piezoelectric element. On some plates, i.e., plates 126, the Pt electrode layer 128 is retracted 1 to 2 mm from an outer periphery 181 and an annular portion 182 around the first opening 112a and extends 1 to 2 mm into the second opening 112b. On other plates, i.e., plates 127, the Pt electrode layer 128 is retracted 1 to 2 mm from the outer periphery 181 and an annular portion around the second opening 112b and extends 1 to 2 mm into the first opening 112a. That is, the plate 127 on which the Pt electrode layer is applied, is obtained by turning the plate 126 to an angle of 180° with respect to the axis of the plate 126.

In forming the lamination, a plate 127 is placed on the bottom, then alternate plates 126 and 127 are piled thereon in such a manner that the first and second openings 112a and 112b of the plates are aligned so as to form openings extending along the axis. In this embodiment, assume 100 plates are used. At the top of the stack is placed a plate 100 with no Pt electrode layer. As in the first embodiment, the stack of plates 126 and 127 are sintered near 1200° C. under compressive condition to form an integral ceramic body. After that, the first and the second openings 112a and 112b are nickel plated, and the electrode rods 122 and 125 are provided in the openings 112a and 112b, respectively.

The operation of this embodiment is similar to that of the first embodiment. In this second embodiment, when voltage is applied to the piezoelectric member 101, no flashover occurs between the piezoelectric member 101 and the casing 104 or the cap 120, because the piezoelectric member 101 has no electrode on the upper and lower ends and outer periphery. In addition to this, this second embodiment has the same effect as the first embodiment.

It should be understood that while the invention has been described in reference to preferred embodiments, various modifications are possible with the spirit of the invention as defined by the claims.

For example, any known ceramic dielectric can be used as material of the plates 26 and 27 (126 and 127), for example, BaTiO$_3$.

Also, the piezoelectric member 1 (101) and the opening 12 (112a and 112b) may be polygonal in cross-section. The opening 12 (112a and 112b) may be formed eccentrically to the axis thereof.

Further, instead of the first (and second) electrode surface 13 (113 and 117), carbon fiber or stainless steel fiber may be filled in the opening 12 (112a and 112b).

Still further, the piston 3 may be omitted. In this case, the lower end 15(115) effects the operation of the piston.

Finally, sintering of the piezoelectric member 1 (101) is not essential, i.e., the piezoelectric member 1 (101) may be formed only by stacking plates 12 (112a and 112b). In this case, instead of the first and second electrode surfaces 13 (113) and 17 (117) tubular electrode members may be disposed in an opening 12 (112a and 112b) and around an outer surface of the member 1.

We claim:

1. A piezoelectric actuator comprising:

a tubular casing having a shoulder portion;

an elongated piezoelectric member disposed in said casing, said piezoelectric member having axially spaced ends one of which abuts the shoulder portion of said casing, said piezoelectric member expanding and contracting in response to an electric potential difference applied thereto, said piezoelectric member forming first and second longitudinal surfaces extending along substantially the entire length of the piezoelectric member, said first surface constituting an opening formed through said piezoelectric member and said second surface constituting an outer surface of said piezoelectric member, said piezoelectric member including a lamination of a plurality of piezoelectric plates having electrode layers therebetween, every other electrode layer extending to said first surface and the other electrode layers which do not extend to said first surface extending to said second surface;

first electrode means for applying a first electric potential to said piezoelectric member, said first electrode means including a first metal plating electrode located at said first surface along substantially the entire length of said piezoelectric member, said first electrode being electrically connected with said every other electrode layer extending to said first surface and an electrode rod being in slidable contact with said first metal plating electrode, said electrode rod having a tubular portion with at least one axially extending slit therein, said tubular portion being urged to said first metal plating electrode so that said tubular portion and first metal plating electrode are kept in contact with each other, and second electrode means for applying a second electric potential to said piezoelectric member, said second electrode means including a second metal plating electrode located at said second surface along substantially the entire length of said piezoelectric member, said second metal plating electrode being electrically connected with every electrode layer extending to said second surface.

2. A piezoelectric actuator comprising:

a tubular casing having a shoulder portion;

an elongated piezoelectric member disposed in said casing, said piezoelectric member having axially spaced ends, one of which abuts the shoulder portion of said casing, said piezoelectric member expanding and contracting in response to an electric potential difference, said piezoelectric member forming first and second longitudinal surfaces extending along substantially the entire length of the piezoelectric member, said first and second surfaces constituting first and second openings formed through said piezoelectric member respectively, said piezoelectric member including a lamination of a plurality of piezoelectric plates having electrode layers therebetween, every other electrode layer extending to said first surface and the other electrode layers which do not extend to said first surface extending to said second surface;

first electrode means for applying a first electric potential to said piezoelectric member, said first electrode means including a first metal plating electrode located at said first surface along substantially the entire length of said piezoelectric member, said first metal plating electrode being electrically connected with said every other electrode layer extending to said first surface and a first electrode rod being in slidable contact with said first metal plating electrode;

second electrode means for applying a second electric potential to said piezoelectric member, said second electrode means including a second metal plating electrode located at said second surface along substantially the entire length of said piezoelectric member, said second metal plating electrode being electrically connected with the electrode layers extending to said second surface, a second electrode rod being in slidable contact with said second metal plating electrode, said first and second electrode rods having respective tubular portions with at least one axially extending slit in each said tubular portion, said tubular portions being urged to said first and second metal plating electrodes, respectively so that said tubular portions and first and second metal plating electrodes are kept in contact with each other.

3. A valve apparatus comprising:

a tubular casing having a shoulder portion;

an elongated piezoelectric member disposed in said casing, said piezoelectric member having axially spaced ends one of which abuts the shoulder portion of said casing, said piezoelectric member expanding and contracting in response to an electric potential difference applied thereto, said piezoelectric member forming first and second longitudinal surfaces extending along substantially the entire length of the piezoelectric member, said first surface constituting an opening formed through said piezoelectric member and said second surface constituting an outer surface of said piezoelectric member, said piezoelectric member including a lamination of a plurality of piezoelectric plates having electrode layers therebetween, every other electrode layer extending to said first surface and the other electrode layers which do not extend to said first surface extending to said second surface;

first electrode means for applying a first electric potential to said piezoelectric member, said first electrode means including a first metal plating electrode located at said first surface along substantially the entire length of said piezoelectric member, said first electrode being electrically connected with said every other electrode layer extending to said first surface and an electrode rod being in slidable contact with said first metal plating electrode, said electrode rod having a tubular portion with at least one axially extending slit therein, said tubular portion being urged to said first metal plating electrode so that said tubular portion and first metal plating electrode are kept in contact with each other, and second electrode means for applying a second electric potential to said piezoelectric member, said second electrode means including a second metal plating electrode located at said second surface along substantially the entire length of said piezoelectric member, said second memtal plating electrode being electrically connected with every electrode layer extending to said second surface, said casing further including an inlet port for being connected to a tank reserving fluid, and outlet port for communicating with a chamber formed in said casing and a check valve permitting fluid to flow from said inlet port to said outlet port, the expansion and contracting of said piezoelectric member changing the size of said chamber.

4. A valve apparatus comprising:

a tubular casing h-ving a shoulder portion;

an elongated piezoelectric member disposed in said casing, said piezoelectric member having axially spaced ends, one of which abuts the shoulder portion of said casing, said piezoelectric member expanding and contracting in response to an electric potential difference, said piezoelectric member forming first and second longitudinal surfaces extending along substantially the entire length of the piezoelectric member, said first and second surfaces constituting first and second openings formed through said piezoelectric member respectively, said piezoelectric member including a lamination of a plurality of piezoelectric plates having electrode layers therebetween, every other electrode layer extending to said first surface and the other electrode layers which do not extend to said first surface extending to said second surface;

first electrode means for applying a first electric potential to said piezoelectric member, said first electrode means including a first metal plating electrode located at said first surface along substantially the entire length of said piezoelectric member, said first metal plating electrode being electrically connected with said every other electrode layer extending to said first surface and a first electrode rod being in slidable contact with said first metal plating electrode;

second electrode means for applying a second electric potential to said piezoelectric member, said second electrode means including a second metal plating electrode located at said second surface along substantially the entire length of said piezoelectric member, said second metal plating electrode being electrically connected with the electrode layers extending to said second surface, a second electrode rod being in slidable contact with said second metal plating electrode, said first and second electrode rods having respective tubular portions with at least one axially extending slit in each said tubular portion, said tubular portions being urged to said first and second metal plating electrodes, respectively so that said tubular portions and first and second metal plating electrodes are kept in contact with each other;

said casing further including an inlet port for being connected to a tank reserving fluid, and outlet port for communicating with a chamber formed in said casing and a check valve permitting fluid to flow from said inlet port to said outlet port, the expansion and contracting of said piezoelectric member changing the size of said chamber.

* * * * *